US010527699B1

United States Patent
Cheng et al.

(10) Patent No.: US 10,527,699 B1
(45) Date of Patent: Jan. 7, 2020

(54) UNSUPERVISED DEEP LEARNING FOR MULTI-CHANNEL MRI MODEL ESTIMATION

(71) Applicant: The Board of Trustees of the Leland Stanford Junior University, Palo Alto, CA (US)

(72) Inventors: Joseph Y. Cheng, Los Altos, CA (US); Shreyas S. Vasanawala, Stanford, CA (US)

(73) Assignee: The Board of Trustees of the Leland Stanford Junior University, Redwood City, CA (US)

( * ) Notice: Subject to any disclaimer, the term of this patent is extended or adjusted under 35 U.S.C. 154(b) by 30 days.

(21) Appl. No.: 16/052,527

(22) Filed: Aug. 1, 2018

(51) Int. Cl.
*G01R 33/561* (2006.01)
*G01R 33/56* (2006.01)
*G06N 3/08* (2006.01)
*G06N 5/04* (2006.01)

(52) U.S. Cl.
CPC ..... *G01R 33/5612* (2013.01); *G01R 33/5608* (2013.01); *G06N 3/088* (2013.01); *G06N 5/046* (2013.01)

(58) Field of Classification Search
CPC ............ G01R 33/5608; G01R 33/5611; G01R 33/5612; G06N 3/088; G06N 5/046
USPC ........................................................ 324/309
See application file for complete search history.

(56) References Cited

U.S. PATENT DOCUMENTS

| 6,841,998 | B1 | 1/2005 | Griswold | |
|---|---|---|---|---|
| 7,132,828 | B2 | 11/2006 | Lustig | |
| 7,282,917 | B1* | 10/2007 | Brau | G01R 33/5611 324/309 |
| 8,026,720 | B1* | 9/2011 | Chen | G01V 3/14 324/309 |
| 8,379,951 | B2 | 2/2013 | Lustig | |
| 8,538,115 | B2 | 9/2013 | Zhang | |
| 8,855,431 | B2 | 10/2014 | Donoho | |
| 9,195,801 | B1* | 11/2015 | Sankaran | G16H 50/30 |
| 9,588,207 | B2 | 3/2017 | Weller | |
| 2006/0029279 | A1 | 2/2006 | Donoho | |
| 2008/0100292 | A1* | 5/2008 | Hancu | G01R 33/10 324/307 |
| 2008/0310696 | A1* | 12/2008 | Hwang | G01R 33/56341 382/131 |
| 2012/0007600 | A1* | 1/2012 | Boernert | G01R 33/5612 324/310 |

(Continued)

*Primary Examiner* — Patrick Assouad
*Assistant Examiner* — Demetrius R Pretlow
(74) *Attorney, Agent, or Firm* — Lumen Patent Firm

(57) ABSTRACT

An MRI apparatus performs multi-channel calibration acquisitions using a multi-channel receiver array and uses a convolutional neural network (CNN) to compute an estimated profile map that characterizes properties of the multi-channel receiver array. The profile map is composed of orthogonal vectors and transforms single-channel image space data to multi-channel image space data. The MRI apparatus performs a prospectively subsampled imaging acquisition and processes the resulting k-space data using the estimated profile map to reconstruct a final image. The CNN may be pretrained in an unsupervised manner using subsampled simulated multi-channel calibration acquisitions and using a regularization function included in a training loss function.

7 Claims, 9 Drawing Sheets

(56) References Cited

U.S. PATENT DOCUMENTS

| | | | | |
|---|---|---|---|---|
| 2013/0088225 A1* | 4/2013 | Weller | ............... | G01R 33/5611 324/307 |
| 2013/0285662 A1* | 10/2013 | Takeshima | ........... | G01R 33/543 324/318 |
| 2014/0037171 A1* | 2/2014 | Bhat | .................... | G06T 11/003 382/131 |
| 2014/0086469 A1* | 3/2014 | Lefebvre | ............... | G06T 11/005 382/131 |
| 2015/0087958 A1* | 3/2015 | Kartmann | ............ | A61B 5/0035 600/411 |
| 2016/0195597 A1* | 7/2016 | Huang | .................. | G01R 33/50 324/309 |
| 2016/0299207 A1* | 10/2016 | Guidon | ............ | G01R 33/56341 |
| 2017/0178318 A1* | 6/2017 | Wang | .................... | G06T 7/0012 |
| 2018/0325461 A1* | 11/2018 | Carroll | .................. | A61B 5/055 |
| 2019/0172230 A1* | 6/2019 | Mailhe | .................. | G06T 11/008 |
| 2019/0257905 A1* | 8/2019 | Cheng | ............. | G01R 33/56545 |

* cited by examiner

UNSUPERVISED DEEP LEARNING FOR MULTI-CHANNEL MRI MODEL ESTIMATION

STATEMENT REGARDING FEDERALLY SPONSORED RESEARCH OR DEVELOPMENT

This invention was made with Government support under contract EB009690 and EB019241 awarded by the National Institutes of Health. The Government has certain rights in the invention.

FIELD OF THE INVENTION

The present invention relates generally to techniques for magnetic resonance imaging (MRI). More specifically, it relates to methods for MRI image reconstruction from subsampled imaging data using a multi-channel receiver array.

BACKGROUND OF THE INVENTION

Magnetic resonance imaging (MRI) is an extremely powerful medical imaging modality. However, this tool is hindered by lengthy acquisitions required for each scan. A fully-sampled high-resolution volumetric scan can take on the order of 5 minutes. Thus, image quality and image resolutions are typically compromised for clinical feasibility and for minimizing artifacts. Moreover, lengthy acquisitions impacts patient comfort and limits the modality to patients who can remain cooperative and still during the extent of the imaging exam.

The combined advancement of imaging receiver hardware with high channel count and model-based reconstruction has enabled the ability to shorten the data acquisition through data subsampling while maintaining high spatial resolutions and high image quality. The set of algorithms, referred as parallel imaging, enables routine clinical scans to be accelerated up to 8-folds: a 5 minutes scan becomes 40 seconds. In parallel imaging, localized sensitivity profiles of each element in a multi-channel coil receiver array are modeled and leveraged to reconstruct high-quality medical images. Prior information about the images can also be included to enable higher subsampling factors—over 2 times the subsampling factor over parallel imaging alone. For example, sparsity in the Wavelet transform domain or sparsity in the finite differences can be leveraged in a compressed-sensing-based image reconstruction. Additionally, these image priors and iterative reconstruction process can be learned via deep learning approaches.

The assortment of model-based techniques to enable high scan reduction through data subsampling all rely on the ability to accurately estimate the imaging model specific for each scan. This imaging model characterizes the process of transforming the desired image to the measured data. The model typically includes the sensitivity maps of each coil receiver, the Fourier transform operator, and data sampling. For optimal performance, sensitivity maps must be characterized for each scan. A separate calibration scan can be performed to measure this information but at the cost of an increase in exam time. Moreover, patient motion may result in mis-registration between calibration and the actual imaging study. The acquisition of the calibration information can be included intrinsically in the scan itself. However, for highly subsampled acquisition, the requirement to include a calibration region in the scan becomes more costly in proportion to the total scan time.

Not only can acquiring calibration data be challenging, accurate estimation of the sensitivity profile information can be computationally expensive especially for multi-dimensional acquisitions (3+ dimensions) and for setups with high coil count (32+ channels) which can take on the order of a few minutes. With the application of deep learning that has enabled massive gains in computational speed (to be on the order of milliseconds) for image reconstruction, the lengthy time needed to estimate the sensitivity profiles becomes a major bottleneck.

BRIEF SUMMARY OF THE INVENTION

Therefore, we introduce a novel deep convolutional neural network (CNN) to perform the estimation of the information needed to model the imaging process. As this CNN models the sensitivity profiles via a deep learning method, we refer to this approach as DeepSENSE. State of the art approaches to derive this imaging model make assumptions about the model. For example, most approaches assume the sensitivity profile to be slowly varying in space. However, if the sensitivity profile includes an accurate estimation of locations with and without signal, the sensitivity profile limits the image support and provides a stronger prior for a more accurate reconstruction. Further, perturbations in the field from patient anatomy alters sensitivity profiles and may add high spatial frequency components that are ignored in conventional approaches. Additionally, learning from these approaches may bias and limit the full potential of the CNN. Thus, we propose to train DeepSENSE in an unsupervised fashion.

The profile map is defined to be a matrix made up of orthonormal vectors such that when the adjoint of the map is applied to the multi-channel dataset in the image domain the number of channels of the dataset may be altered. We refer to the output at this stage as latent coil images. The multi-channel data are acquired using an coil-array, so we will also refer to the latent coils as latent channels. When the profile map is then applied, the result should be equivalent to the original multi-channel dataset given that the original multi-channel dataset was fully sampled in the k-space domain.

The profile map characterizes the multi-channel receiver array in a way that goes beyond what is traditionally considered as physical sensitivity profile maps. For example, information indicating where there is signal from the subject and where there is no signal is not part of conventional physical sensitivity profile maps that characterize properties of the receiver RF coils. However, this information may be included in the multi-channel data used to train the CNN, and it can be characterized and exploited for the reconstruction using a profile map, which we also refer to as a sensitivity profile map or sensitivity profile.

Embodiments of the invention train a CNN to model the map estimation process in an unsupervised fashion. This unsupervised framework enables the ability to enforce properties when the estimated maps are used to combine the multi-channel data. Previous approaches do not have this feature. The technique enables sensitivity maps to have higher spatial resolutions and allows the sensitivity maps to transform the input data into a space that is easier for the reconstruction to accurately estimate missing samples. It is also possible using this technique to train an end-to-end network that performs both sensitivity map estimation and the application of these maps for the reconstruction.

In one aspect, the invention provides a method for magnetic resonance imaging comprising: performing by an MRI apparatus multi-channel calibration acquisitions using a multi-channel receiver array of the MRI apparatus; computing from a convolutional neural network (CNN) and the multi-channel calibration acquisitions an estimated profile map that characterizes properties of a multi-channel receiver array, wherein the profile map is composed of orthogonal vectors and transforms single-channel image space data to multi-channel image space data; performing by the MRI apparatus a prospectively subsampled imaging acquisition using the multi-channel receiver array to produce k-space data; and processing by the MRI apparatus the k-space data to reconstruct a final image using the estimated profile map.

In some implementations, the adjoint (or conjugate transpose) of the profile map transforms the multi-channel image space data to a set of latent multi-channel image space data; and the profile map transforms this latent multi-channel image space data back to the original multi-channel image space data.

Computing the estimated profile map may include applying the multi-channel calibration acquisitions as input to the CNN, where the output of the CNN is the estimated profile map.

The multi-channel calibration acquisitions and the prospectively subsampled imaging acquisition may be acquired in the same scan, and may be derived from the same raw data.

The CNN may be pretrained using subsampled simulated multi-channel calibration acquisitions and using a regularization function included in a training loss function.

Processing the k-space data to reconstruct a final image preferably uses a regularization function, wherein the regularization function is also used in a training loss function.

Processing the k-space data to reconstruct a final image may use a second CNN trained with k-space data and the profile map from the first CNN, where an output of the second CNN is the reconstructed final image.

DETAILED DESCRIPTION OF THE INVENTION

In embodiments of the present invention, a profile map S is leveraged to constrain a model-based reconstruction of an image from MRI acquisition data to enable accurate image recovery despite subsampling in the acquisition. The image reconstruction problem for an image y can be modeled with the following equation:

$$\hat{y} = \arg\min_y \frac{1}{2} \|ESy - u\|_2^2 + \lambda R(y), \quad (1)$$

where $\hat{y}$ is the reconstructed image, u is the measured k-space acquisition data, E is an encoding matrix, R(y) is a regularization function and $\lambda$ is a corresponding regularization parameter.

In this equation, the data acquisition model A=ES includes applying S to the desired image y to yield the multi-channel image data c=Sy. Afterwards, the encoding matrix E is applied to transform the multi-channel image data c to k-space. This encoding matrix E can include data subsampling in the k-space domain. The resulting k-space data should be close in value to the measured k-space data u in the least-squares sense. For highly subsampled acquisition, the image recovery problem becomes ill posed, and the recovery problem can be further constrained with a regularization function R(y) and a corresponding regularization parameter $\lambda$ as demonstrated for compressed-sensing based reconstructions.

Deep convolutional neural networks (CNNs) are extremely flexible and powerful in accurately modeling complex systems. Here, we provide a method to estimate S using a pre-trained CNN. The input to the network is a multi-channel image set to be reconstructed. Depending on how the CNN is trained, the input can be the image-domain data constructed from the k-space calibration region zero-padded to the desired matrix size or from the subsampled k-space dataset to be reconstructed. Regardless, the CNN will be trained to output sensitivity profile maps. We refer to this network as DeepSENSE for its ability to generate sensitivity profile maps.

The simplest approach to train the CNN would be applying supervised learning. However, accurate sensitivity profile maps S are difficult to obtain. Furthermore, we do not want to bias our training based on current approaches. Therefore, the present invention provides a technique that enables unsupervised learning. More specifically, the CNN is trained based on how the output will be applied instead of training the CNN based on an ideal estimate of S. The aim of the CNN is to be able to produce a profile map S that can transform the reconstructed image y to a multi-channel data set c.

In order to train this model, we leverage previously collected fully sampled multi-channel acquisitions. For standard MRI scans, the underlying image y is an unknown. What is received is image y modulated by the sensitivity profiles of the RF receiver coils and encoded (or transformed) into the k-space as signal u.

Figure 1:
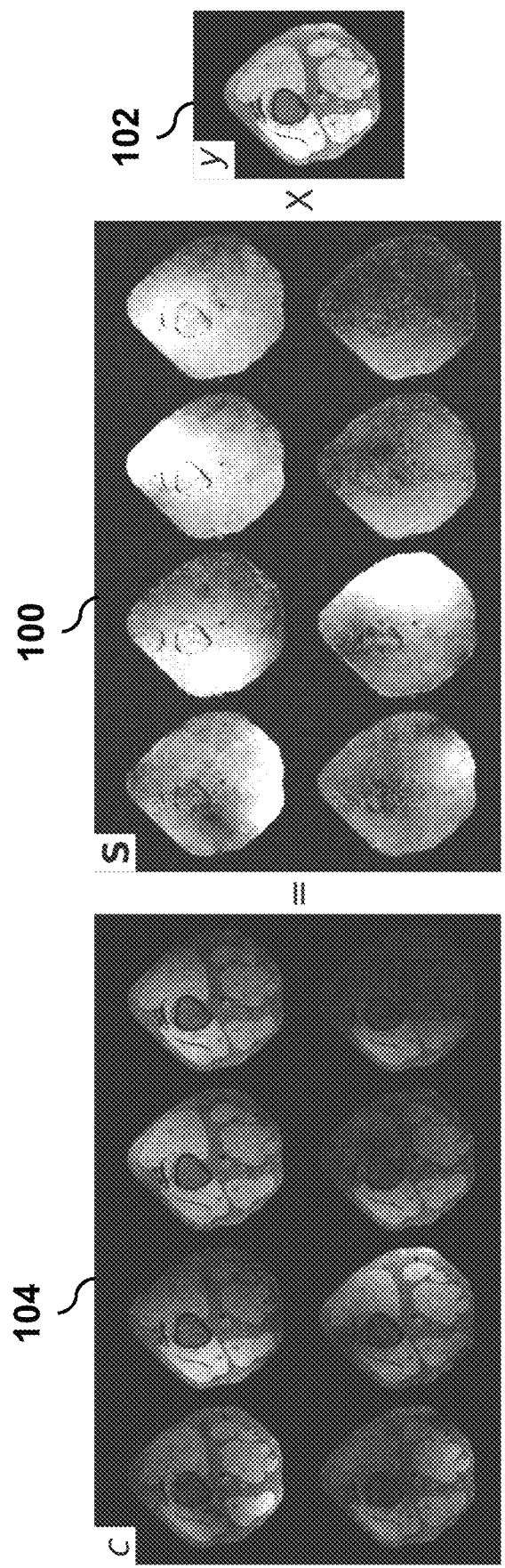
FIG. 1 is a schematic overview of a multi-channel MR imaging model represented with images, showing how a sensitivity map is applied to an underlying signal to obtain a multi-channel data set.

FIG. 1 shows an overview of a multi-channel MR imaging model represented schematically with images, where the sensitivity map 100 is applied to an underlying signal 102 to obtain a multi-channel data set 104, i.e., c=Sy. Acquisition data is obtained by an MRI apparatus using a multi-channel coil-receiver array. As a result, the underlying signal y is modulated by the sensitivity profiles of each of the coil-receiver array elements as characterized by S. The raw multi-channel acquisition data u are measured in the k-space domain. For a fully-sampled acquisition, this multi-channel k-space data can be transformed into the image domain to obtain multi-channel image dataset c. This process can be accomplished by undoing the encoding matrix; in the case of the fully-sampled acquisition, this can be achieved with an inverse Fourier transform.

Under the assumption that S has an orthonormal basis, the following equation holds:

$$c = SS^H Sy = SS^H c \quad (2)$$

where $S^H$ is the adjoint of S. Matrix S expands a single-channel image y to $N_c$ channels of images. Matrix $S^H$ coil-combines the $N_c$-channel image back to a single channel. This expansion and reduction of number of channels are important properties that will be leveraged to train a CNN to estimate S on future datasets. Note that the number of channels to reduce the multi-channel is a design parameter that can be modified. For instance, matrix $S^H$ can be designed to reduce the number of channels to two channels. We refer to the image produced from $S^H c$ as a latent image. Since this latent image can have multiple channels, this latent image can also be referred to as latent coil images.

As an initial step for training, we extract calibration multi-channel image domain data b from the fully-sampled multi-channel dataset example c and produce S from a multi-channel image b using a CNN $G_\theta(b)$:

$$S_g = G_\theta(b). \quad (3)$$

Subscript g denotes the fact that $S_c$ is generated from the CNN $G_\theta$ where θ represents the learned model parameters. Since multi-channel dataset c is constructed from the fully-sampled k-space data, we have the ability to extract only the k-space data samples that we will collect for future scans. From the subsampled k-space acquisition, an inverse Fourier transform converts the k-space data to image b.

Note that we can extend this approach to situations where a separate calibration scan is available by constructing b from the k-space samples collected for the calibration scan. In practice, this low-resolution calibration scan is acquired as a separate scan prior to the acquisition of the new dataset to be reconstructed. As an alternative, this low-resolution calibration data can be acquired as part of the same scan to be reconstructed. When the calibration data is collected as part of the same scan, the k-space acquisition will include a calibration region. We define the calibration data to be the data that will be the input to the trained CNN $G_\theta$.

Conventionally, only the calibration region, a small region at the center of the k-space, is used to estimate sensitivity maps; thus, the estimated sensitivity maps are limited in spatial resolution. Since the CNN $G_\theta(.)$ takes image domain data as input, we can train the fully convolutional network to include all measured data with no computation penalty. For subsampled acquisitions, this setup enables the inclusion of high-spatial frequency information to enable the estimation of high-resolution spatial maps $S_g$. Additionally, $G_\theta(.)$ can be trained where b is constructed from k-space data subsampled in the center k-space regions.

The derivation of $S_g$ is fundamentally a different problem compared to image de-noising/de-aliasing or super-resolution. CNNs, such as the ResNet architecture used in the present invention can successfully tackle these image recovery problems, and, here, we leverage the network structure to perform this image recovery task only if it is needed. Internally, the network can generate higher-resolution and de-noised images, but the final product of interest is $S_g$ that will be used for the image recovery problem of Eq. 1.

The estimated sensitivity profile $S_g$ does not need to accurately model the coil sensitivity profiles of the physical hardware. The estimated $S_g$ only needs to assist in an accurate image reconstruction. Thus, this feature enables flexibility in the estimation process. For the training of CNN $G_\theta(.)$, we leverage the properties of the $S_g$ that are important for accurate image reconstruction. In particular, these important properties of $S_g$ are 1) the fact that $S_g$ characterizes the relationship between the different channels of the multi-channel dataset, and 2) the fact that $S_g$ characterizes the relationship between the underlying image y and the multi-channel image dataset. For 1), the overlap of information and the unique information between different channels are important and are leveraged for the reconstruction. For 2), the fact that there is a single underlying image is important in further constraining the reconstruction.

To learn the parameters θ in $G_\theta(.)$, we solve the following optimization problem:

$$\hat{\theta} = \arg\min_\theta \sum_i \|G_\theta(b_i)(G_\theta(b_i))^H c_i - c_i\|_1, \quad (4)$$

where the i-th training example $c_i$ is multi-channel image dataset produced from fully-sampled k-space acquisition data, and where image $b_i$ is produced from the simulated measurement/calibration data derived from $c_i$. More specifically, k-space sampling mask $M_i$ used to acquire future subsampled scans is used to generate image $b_i$ from image $c_i$:

$$b_i = \mathcal{F}^{-1}\{M_i F\{c_i\}\}, \quad (5)$$

where $\mathcal{F}$ and $\mathcal{F}^{-1}$ are the forward and inverse Fourier transforms. Mask $M_i$ are designed based on conventionally sampling used in clinical practice; these sampling strategies include uniform sampling, variable-density sampling, and poisson-disc pseudo-random sampling. Newly developed sampling strategies used in clinically practice can be incorporated into the training process. In Eq. 4, an $l_1$ loss is used in the training to minimize the pixel-wise difference. This equation can be easily modified to support other and combinations of loss functions.

In this framework, we do not explicitly enforce how these sensitivity maps should look for supervised training. Instead, we constrain the training to enforce how the sensitivity maps should function. This unsupervised approach is not only powerful, but also extremely flexible. To demonstrate this flexibility, we explore expanding Eq. 4 with additional constraints. As the problem formation stands, many different solutions exist for estimating $S_g$. For instance, the phase of the sensitivity profile maps can be rotated and the resulting $S_g$ satisfies the same constraints. Also, if there is no signal in areas of the images, the sensitivity maps can have arbitrary structure and signal in those regions. Additional loss functions can be included in Eq. 4 to produce more desirable sensitivity profile maps. As an example, we modify Eq. 4 as $$\hat{\theta} = \arg\min_\theta \sum_i \|G_\theta(b_i)(G_\theta(b_i))^H c_i - c_i\|_1 + \lambda \|\mathcal{I}\{(G_\theta(b_i))^H c_i\}\|_1, \quad (6)$$

where the imaginary component of the coil-combined image, extracted using function $\mathcal{I}\{.\}$, is minimized in the $l_1$ sense. In other words, model parameters θ are found for $G_\theta(.)$ that produces sensitivity maps $S_g$ where the imaginary component of the coil-combined image is minimized. Because this technique trains the DeepSENSE network to produce a coil-combined image with this specific property, this property can be included in the model-based reconstruction in Eq. 1 as an additional constraint:

$$\hat{y} = \underset{y}{\operatorname{argmin}} \frac{1}{2} \|ES_g y - u\|_2^2 + \lambda \|\mathcal{I}\{y\}\|_1. \tag{7}$$

Other possible regularization functions include spatial Wavelets and total variation.

Estimating regions with no signal in the final image y is extremely powerful in further constraining the image reconstruction problem. To leverage this property, $S_g$ should be zero at pixel locations where there is no image signal and non-zero where there is image signal. This property can be promoted by regularizing Eq. 4 with a regularization function performed on the output of $G_\theta(b_i)$.

An example regularization function that promotes this property is the regularization function $\|G_\theta(b_i)\|_1$.

This entire training procedure can be modified to consider only subsampled training examples. In such a case, each multi-channel example is subsampled in the k-space domain as u. The multi-channel k-space u is then directly transformed into the image domain with an inverse Fourier transform as multi-channel image c. In Eq. 3, the multi-channel image can be used as the multi-channel image b. During training, the first term of Eq. 6 is relaxed; the multi-channel training example $c_i$ is no longer fully sampled and applying the learned profile maps on $c_i$ will not yield exactly the same dataset $c_i$, but the result will be close. Given enough training examples, the learned CNN will produce profile maps that will on average minimize the distance between $c_i$ and the result of $c_i$ after applying the profile maps. In other words, given enough training samples, we can train the network to learn through the subsampling aliasing artifacts. The regularization term in Eq. 6 helps stabilize the training.

The framework for training the DeepSENSE network can be further extended by minimizing final reconstruction error. This extension can be practically performed using a pre-trained neural network that models the parallel imaging and compressed sensing reconstruction. As noted by Eqs. 6 and 7, the estimation of $S_g$ should be coupled with the application of $S_g$ to solve the image recovery problem. If $S_g$ promotes a reconstructed y with sparse imaginary component, the model-based reconstruction should leverage that information. Thus, for optimal performance, the network that models the sensitivity map estimation and the reconstruction network should be trained together in an end-to-end fashion. To demonstrate this ability, we built a deep-neural-network modelled after the compressed-sensing-based reconstruction algorithm. We refer to this network as DeepRecon.

Figure 8:
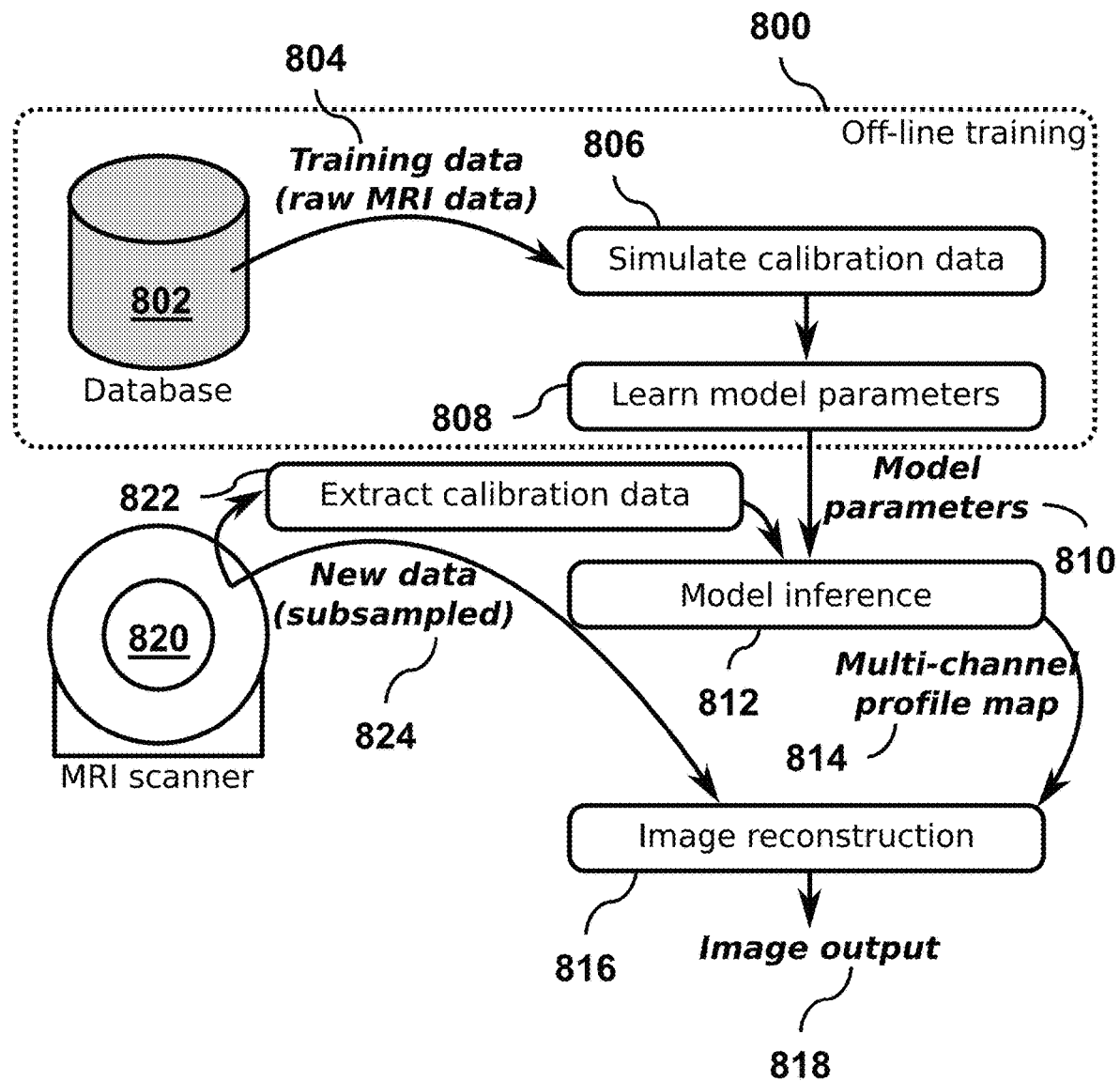
FIG. 8 is a schematic overview of a processing pipeline according to an embodiment of the invention.

FIG. 8 is a schematic overview of a processing pipeline according to an embodiment of the invention. An MRI apparatus 820 performs multi-channel calibration acquisitions using a multi-channel receiver array of the MRI apparatus in the form of extracted calibration data 822. A convolutional neural network performs model inference 812 using the extracted calibration data 822 as input and providing an estimated profile map 814 as output. The profile map characterizes properties of a multi-channel receiver array. It is composed of orthogonal vectors and transforms single-channel image space data to multi-channel image space data. The MRI apparatus 820 performs a prospectively subsampled imaging acquisition using the multi-channel receiver array to produce k-space data 824. This k-space data 824 can include the information from the calibration data 822. In an image reconstruction step 816, MRI apparatus 820 processes the k-space data 824 to reconstruct a final image 818 using the estimated profile map 814 obtained from the CNN output.

In an off-line training process 800 the CNN is pre-trained in an unsupervised learning step 808 using simulated calibration data from a simulation step 806 as input. The simulated calibration data 806 is obtained from multi-channel calibration acquisitions 804 stored in a database 802. The training preferably uses a regularization function included in a training loss function. The MRI manufacturer can ship the machine with a pre-trained CNN and they have the option to update the model. The simulation of the calibration data can be done by extracting the position of the k-space data that will be collected as part of a calibration scan, essentially extracting the center region of k-space to generate a low resolution image. Alternatively, it can be done by applying the sampling mask that will be used to collect future scans and using the entire subsampled k-space data as the calibration data.

Figure 2A:
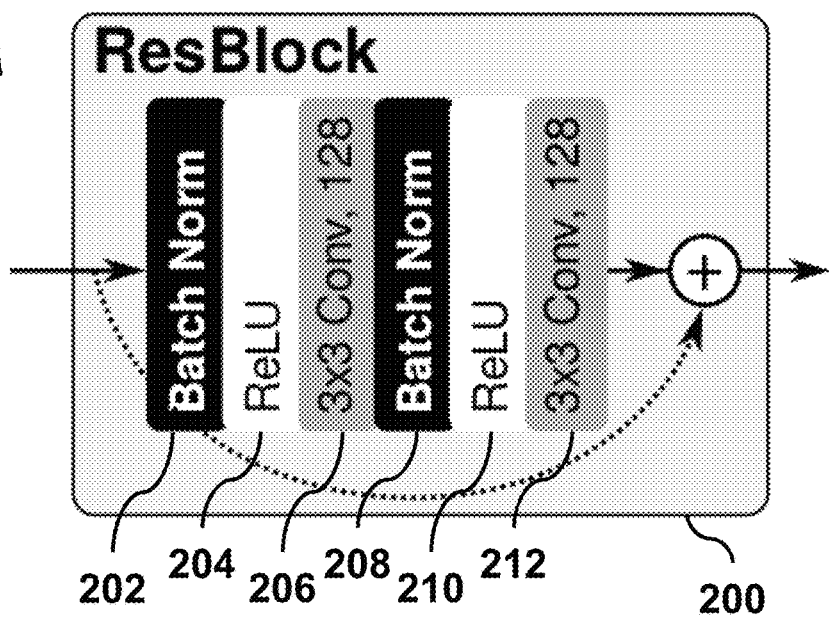
FIGS. 2A-C are schematic block diagrams of components of a convolutional neural network architecture, showing a residual block, profile map network, and reconstruction network, respectively.
Figure 2B:
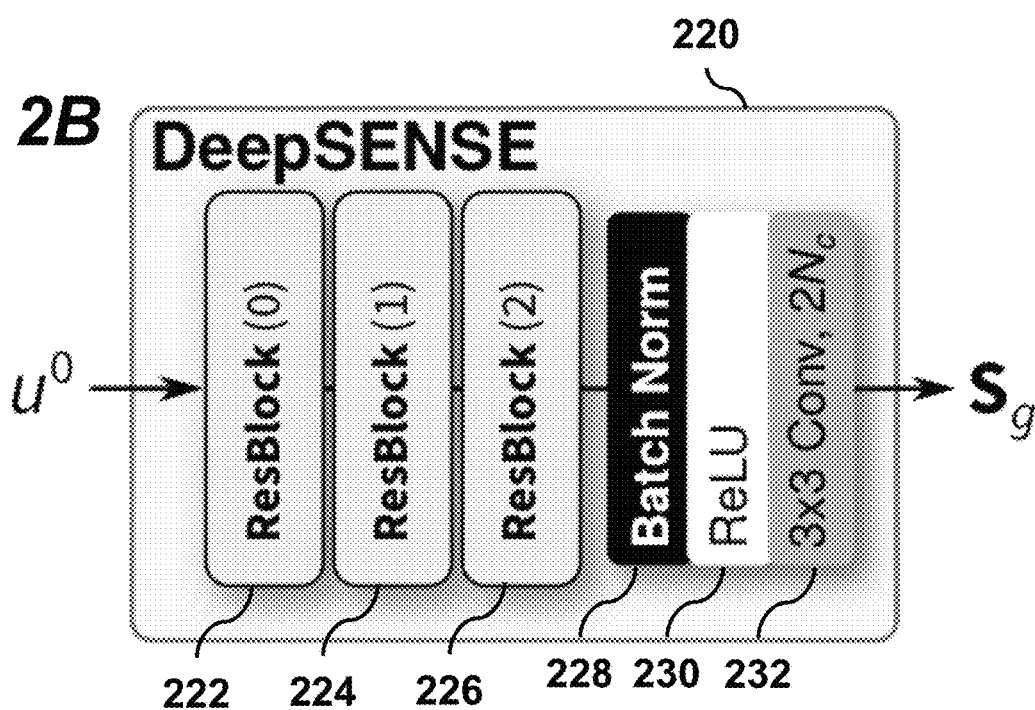
Figure 2C:
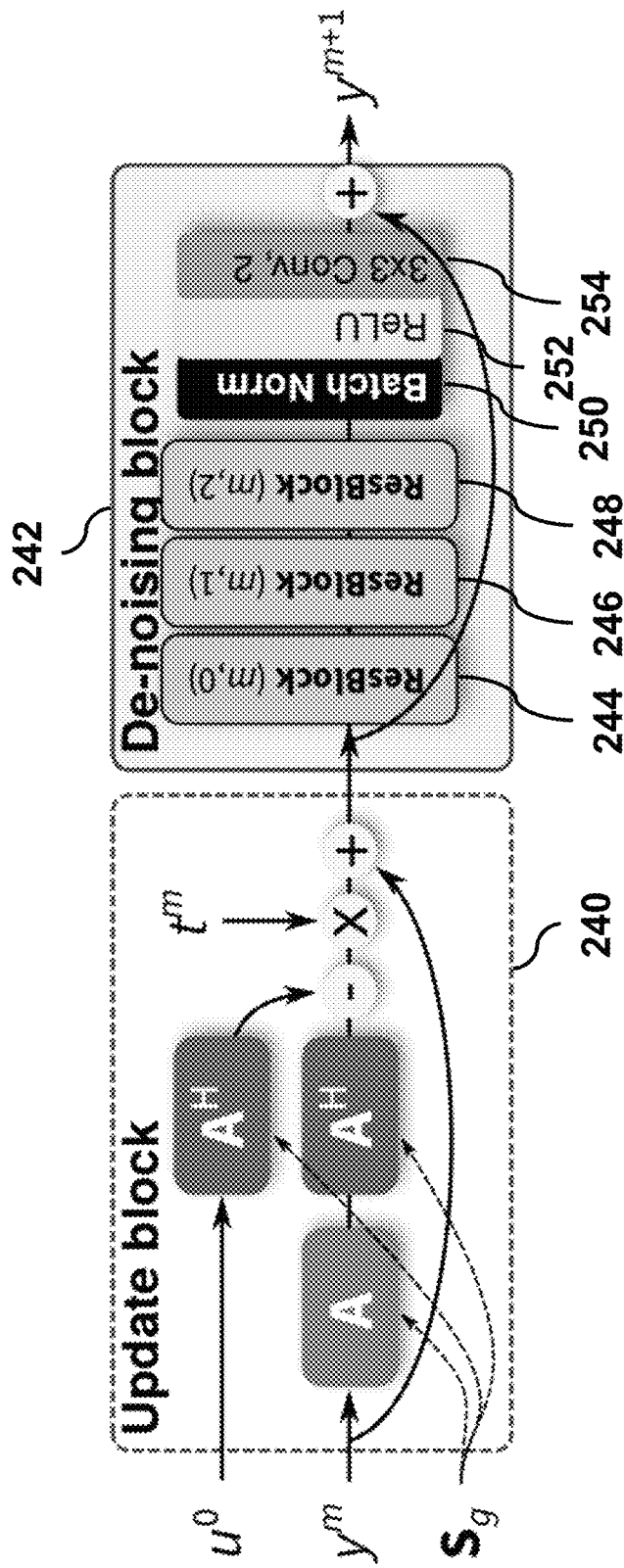

FIGS. 2A-C provide an overview of network architecture. FIG. 2A shows a residual block 200 used as the basic building block. It includes batch normalization 202, rectified linear unit activation 204, and 3×3 convolutions 206. This sequence of three blocks in repeated again as 208, 210, 212, respectively. If the number of input channels is differs from the output channel, a 1×1 convolution is used to project the input data to the same number of channels as the output (dotted line). An example DeepSENSE network 220 is shown in FIG. 2B. The raw acquisition data u° is input to the CCN 220. The output $S_g$ of the DeepSENSE network is used in the unrolled reconstruction network, DeepRecon. The m-th iteration of the reconstruction network is shown in FIG. 2C.

This DeepSENSE network $G_\theta$ contains three residual blocks 222, 224, 226, each having the structure shown in FIG. 2A, followed by batch normalization 228, rectified linear unit activation 230, and 3×3 convolutions 232. For simplicity, the real and imaginary components are treated as separate channels when applying the different CNNs, but the network can be adapted to supported complex operations. The subsampled dataset is represented by u⁰ and is the input to $G_\theta$ as represented by the DeepSENSE block.

Since the optimal estimated $S_g$ is coupled to the reconstruction process used, we also construct a deep neural network to model the reconstruction process. An unrolled-type architecture based on fast iterative soft-threshholding algorithm is used for our experiments as shown in FIG. 2C. An update block 240 takes as input raw acquisition data u⁰ and m-th image estimate $y^m$, using the estimated $S_g$ to generate an updated image estimate, which is then processed by de-noising block 242 to produce the de-noised image estimate $y^{m+1}$. The de-noising block 242 contains three residual blocks 244, 246, 248, each having the structure shown in FIG. 2A, followed by batch normalization 250, rectified linear unit activation 252, and 3×3 convolutions 254. The values for $t^m$ in update block 240 and the convolutional kernels in the de-noising block 242 are learned. The term $t^m$ is essentially a weighting to determine how much to update the current $y^m$ based on the gradient of the $l_2$ term in the reconstruction optimization problem of Eq. 1. Model A incorporates the estimated $S_g$ as follows:

$$u = Ay = ES_g y. \tag{8}$$

In other words, A transforms a single-channel y in the image domain to a multi-channel dataset in the k-space domain.

The adjoint, $A^H$, transforms a multi-channel dataset in the k-space domain to a single-channel dataset in the image domain.

Proton-density-weighted knee datasets were used for experiments. These 20 fully-sampled volumetric scans were acquired on a 3T scanner with a 3D fast spin echo sequence. An 8-channel knee coil was used. Since the readout is always fully sampled in the Cartesian acquisition, a one-dimensional inverse Fourier transform is first applied to the dataset in the readout, x, dimension. This process transforms the data from k-space with $(k_x, k_y, k_z)$ to a hybrid $(x, k_y, k_z)$-space. Each slice in the x dimension is then treated as a separate sample. The entire dataset was divided as 14 subjects (4e3 slices) for training, 2 subjects (640 slices) for validation, and 3 subjects (960 slices) for testing.

Subsampling in the $(k_y, k_z)$-plane was performed using poisson-disc subsampling. For comparisons, sensitivity maps were also estimated using a state-of-the-art algorithm, ESPIRiT. Based on the eigen-values in the ESPIRiT algorithm, the sensitivity maps can be cropped to reduce the image support. Sensitivity maps were estimated twice: once without cropping and once with an automated cropping algorithm. A number of different reconstruction algorithms were performed using the estimated sensitivity maps. A simple parallel imaging algorithm was first performed using SENSE. Additionally, spatial Wavelet regularization was included for a compressed-sensing-based reconstruction. The subsampling and reconstruction algorithms were performed using the Berkeley Advanced Reconstruction Toolbox (BART).

The deep neural networks were implemented and trained using TensorFlow. Adam optimizer was used for training. During each training step, example datasets were subsampled with a pseudo-randomly-generated poisson disc mask. The following metrics were computed: peak to signal noise ratio (PSNR), normalized root mean square error normalized by the reference (NRMSE), and structural similarity (SSIM).

Figure 3:
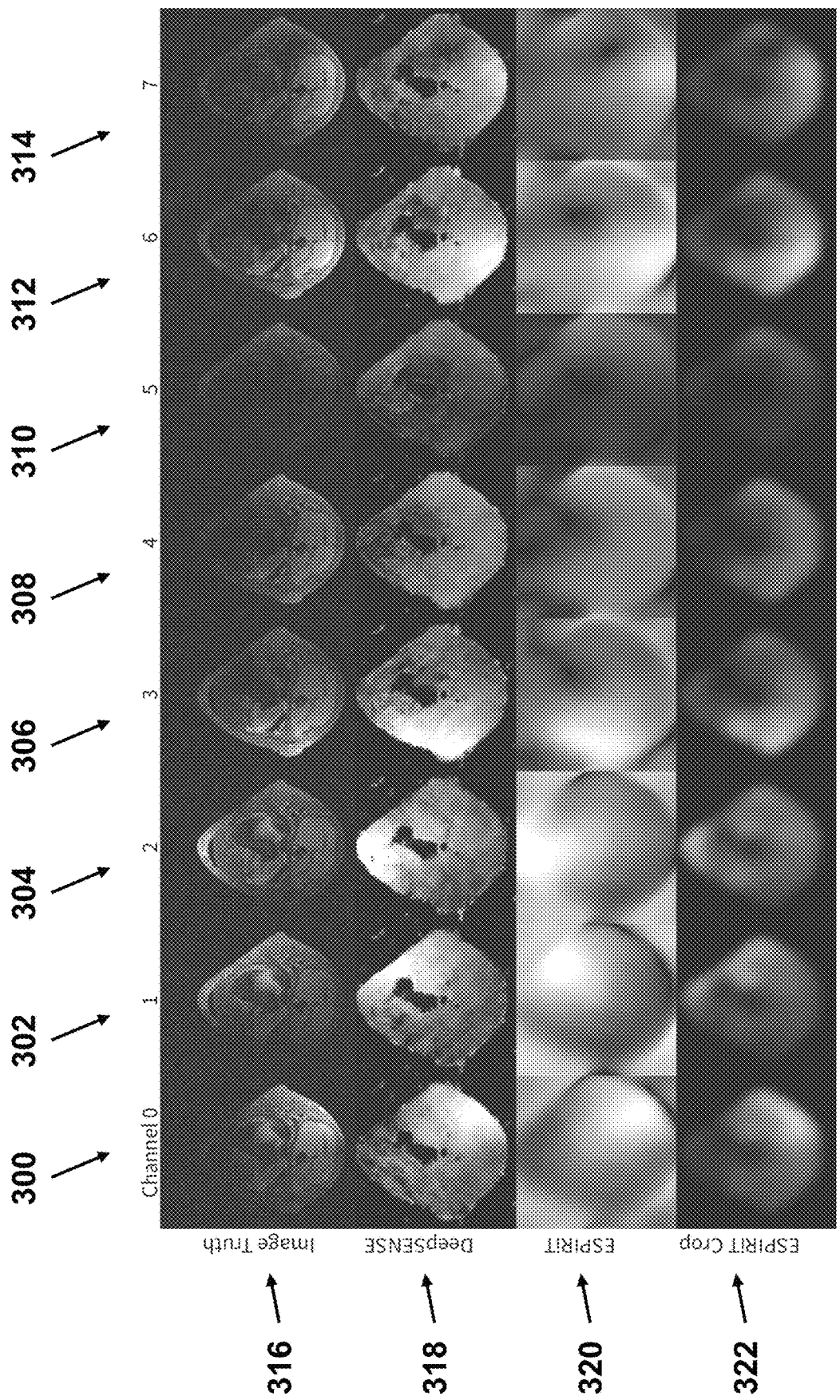
FIG. 3 shows examples of estimated sensitivity maps for four datasets having eight channels each.

Example test results of the trained CNN for sensitivity map generation, DeepSENSE, through unsupervised training is shown in FIG. 3. The network is trained with both spatial Wavelet regularization and imaginary-component regularization. These maps are applied in a number of different reconstruction methods in FIG. 4, and the DeepSENSE produced maps yielded comparable results to the state-of-the-art ESPIRIT.

FIG. 3 shows estimated sensitivity maps for a test example. Rows 316, 318, 320, 322 correspond to four datasets. Columns 300, 302, 304, 306, 308, 310, 312, 314, correspond to eight channels for each dataset. The fully-sampled 8-channel dataset is shown in row 316. The data was subsampling by a factor of 7.4 with a variable-density poisson disc sampling. Row 318 shows sensitivity maps estimated using the trained CNN, DeepSENSE. Conventional state-of-the-art algorithm, ESPIRiT, was used to estimated maps for comparison without cropping, shown in row 320, and with automated cropping, shown in row 322. Conventionally, for speed of acquisition and estimation, only the center k-space region is used to estimate maps 320 and 322. DeepSENSE uses the full subsampled dataset 316 to estimate a higher resolution map 318 that provides a much stronger prior for image reconstruction. The DeepSENSE network was trained with spatial Wavelet and imaginary-component regularization.

Figure 4:
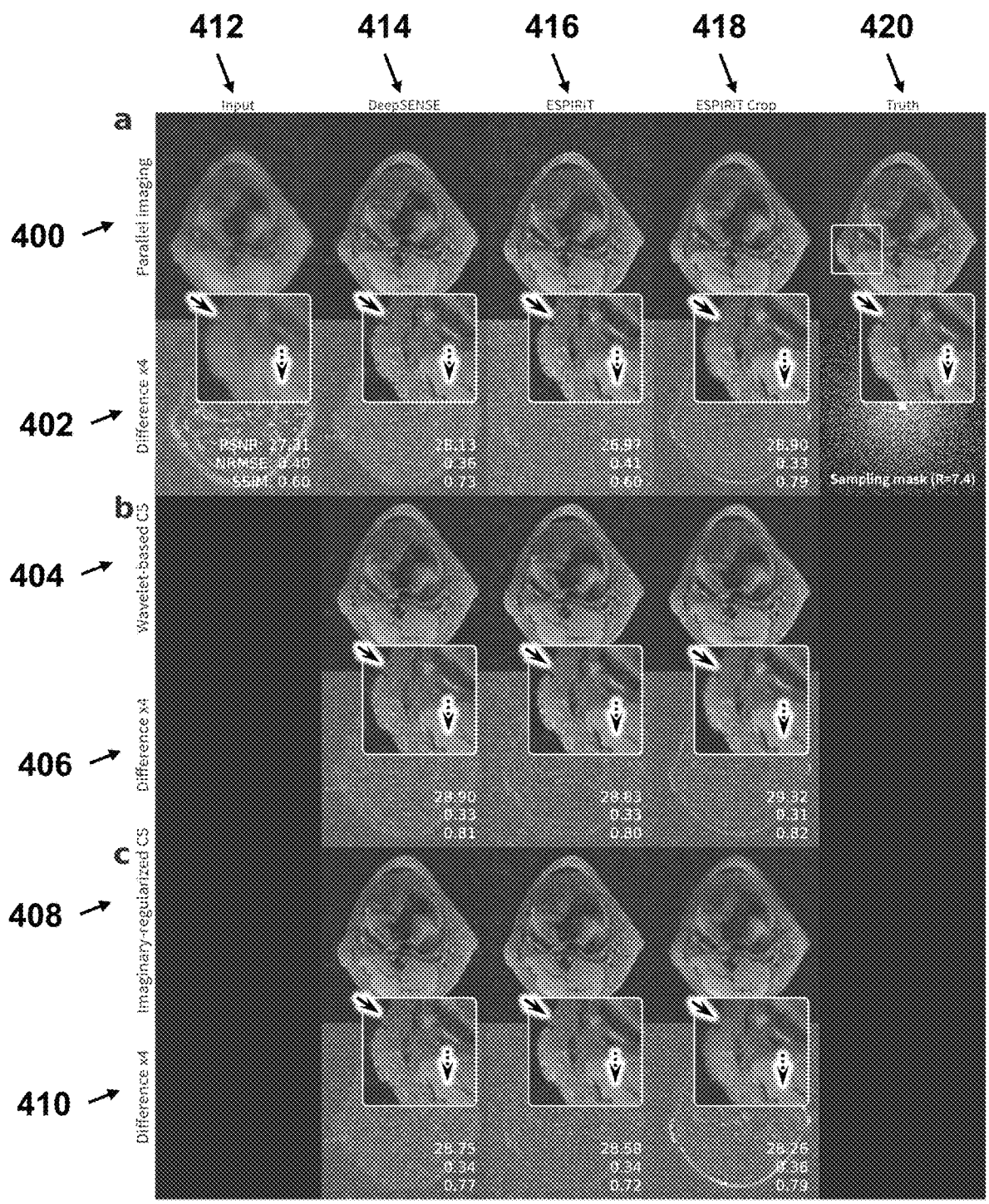
FIG. 4 shows images reconstructed using estimated sensitivity maps from FIG. 3.

FIG. 4 shows images reconstructed using estimated sensitivity maps from FIG. 3 for a test example. Three different reconstructions were performed. Rows 400 and 402 (difference×4) are parallel imaging, rows 404 and 406 (difference ×4) are compressed sensing (CS) and parallel imaging with spatial Wavelet regularization, and rows 408 and 410 (difference ×4) are CS and parallel imaging with regularization on the imaginary component. Column 412 is the input, 414 DeepSENSE, 416 ESPIRiT, 418 ESPIRiT Crop, and 420 truth image.

Accurate cropping of sensitivity maps is essential for an accurate reconstruction as noted by the aggressive cropping and lost of signal in the outer edges for the ESPIRiT with cropping (solid arrow). Using DeepSENSE, image quality is comparable to standard approaches and seen by recovering of spatial resolution (dotted arrow). Furthermore, DeepSENSE has the ability to be trained to enable imaginary-component regularization unlike conventional approaches, and therefore, DeepSENSE yielded more accurate reconstructions.

Figure 5:
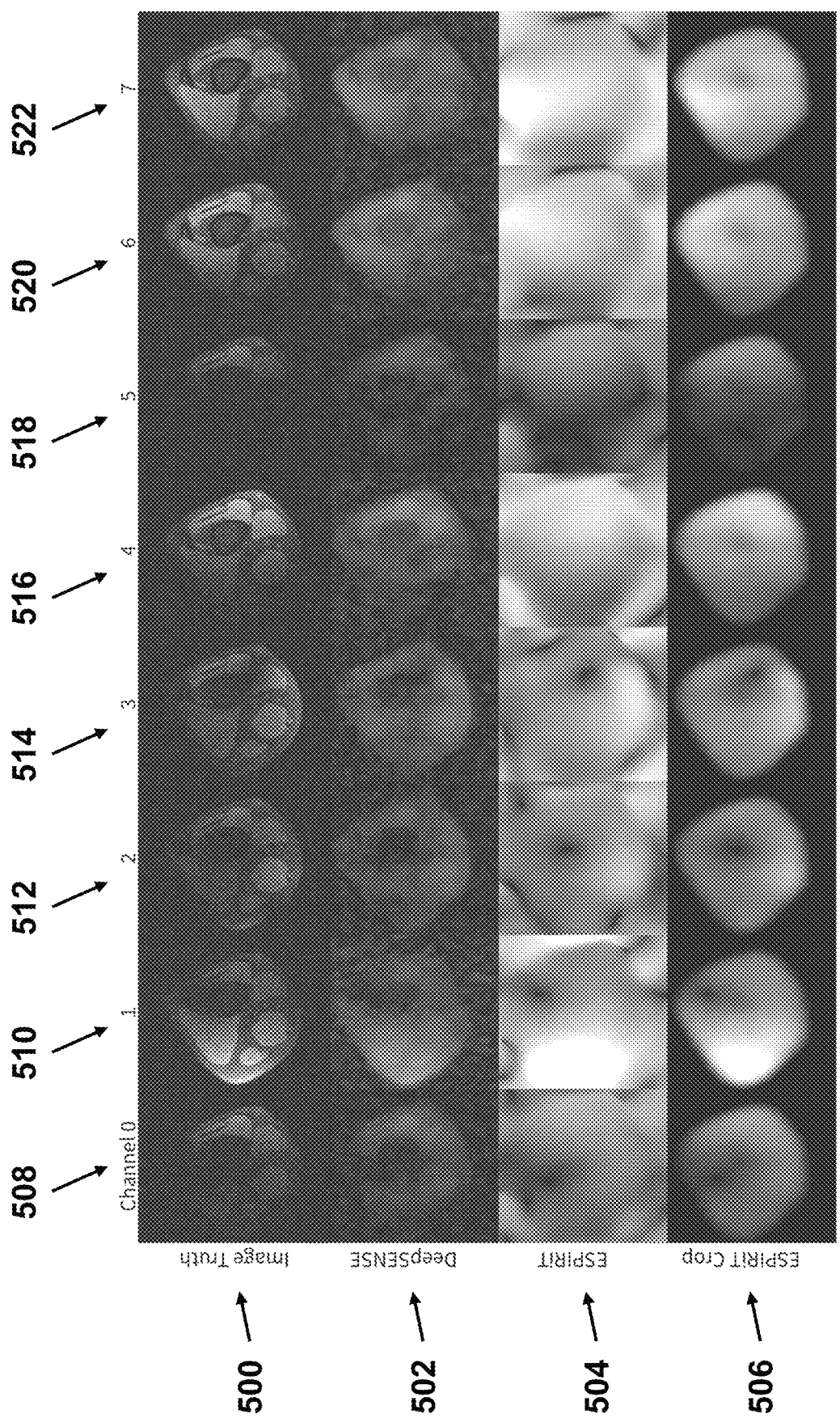
FIG. 5 shows reconstruction image results for four datasets with eight channels each.
Figure 6:
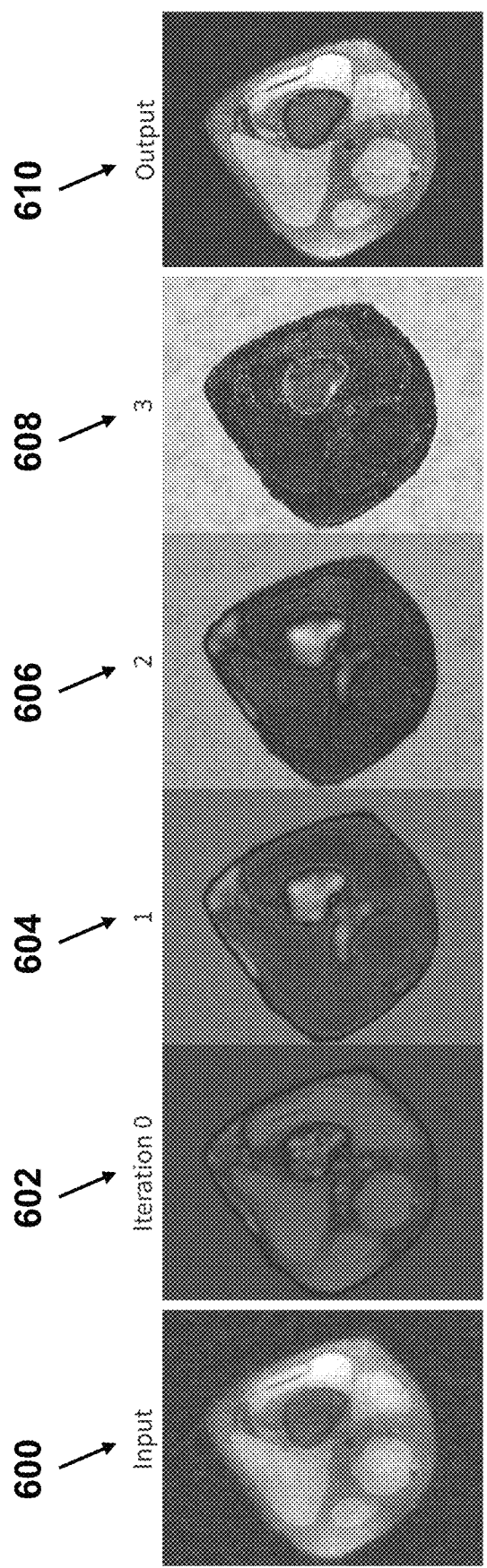
FIG. 6 shows example iterations in the unrolled reconstruction network.

The DeepSENSE network was also trained simultaneously with a 4-step unrolled reconstruction network (DeepRecon) in an end-to-end fashion. Because the result of the DeepSENSE network is multiplied by the result of each stage in the DeepRecon network, the training of the two networks can quickly diverge. Therefore, we alternated the training of the different networks every 20 steps. The learning rate was set to $1 \times 10^{-3}$. Example test results from the final DeepSENSE network are shown in FIG. 5. Images at each stage of the DeepRecon network are shown in FIG. 6. The final reconstruction is compared with state-of-the-art algorithms of ESPIRiT and compressed-sensing-based parallel imaging in FIG. 7. In this example, the DeepSENSE and DeepRecon network yielded more accurate results. Note that the accuracy can be further improved with more stages in the DeepRecon network.

FIG. 5 shows an example of test result using end-to-end training. Rows 500, 502, 504, 506 correspond to four datasets. Columns 508, 510, 512, 514, 516, 518, 520, 522, correspond to eight channels for each dataset. The fully-sampled 8-channel dataset is shown in 500. The data was subsampling by a factor of 7.4 with a variable-density poisson disc sampling, and sensitivity maps were estimated using the trained CNN, DeepSENSE that is trained simultaneously with the unrolled reconstruction network, in 502. Conventional state-of-the-art algorithm, ESPIRiT, was used to estimated maps for comparison without cropping in 504 and with automated cropping in 506.

FIG. 6 shows example iterations in the unrolled reconstruction network that is trained simultaneously with the DeepSENSE network. The image input is shown in 600. The unrolled reconstruction network has 4 "iterations," and the output of each "iteration" is shown in 602, 604, 606, 608. The final output is shown in 610. The final output is multi-channels and is shown in 610 using the square-root of sum-of-squares. By simultaneously training both networks, DeepSENSE produces a set of maps that transforms the data into a latent space that is ideal for de-noising using convolutional neural networks.

Figure 7:
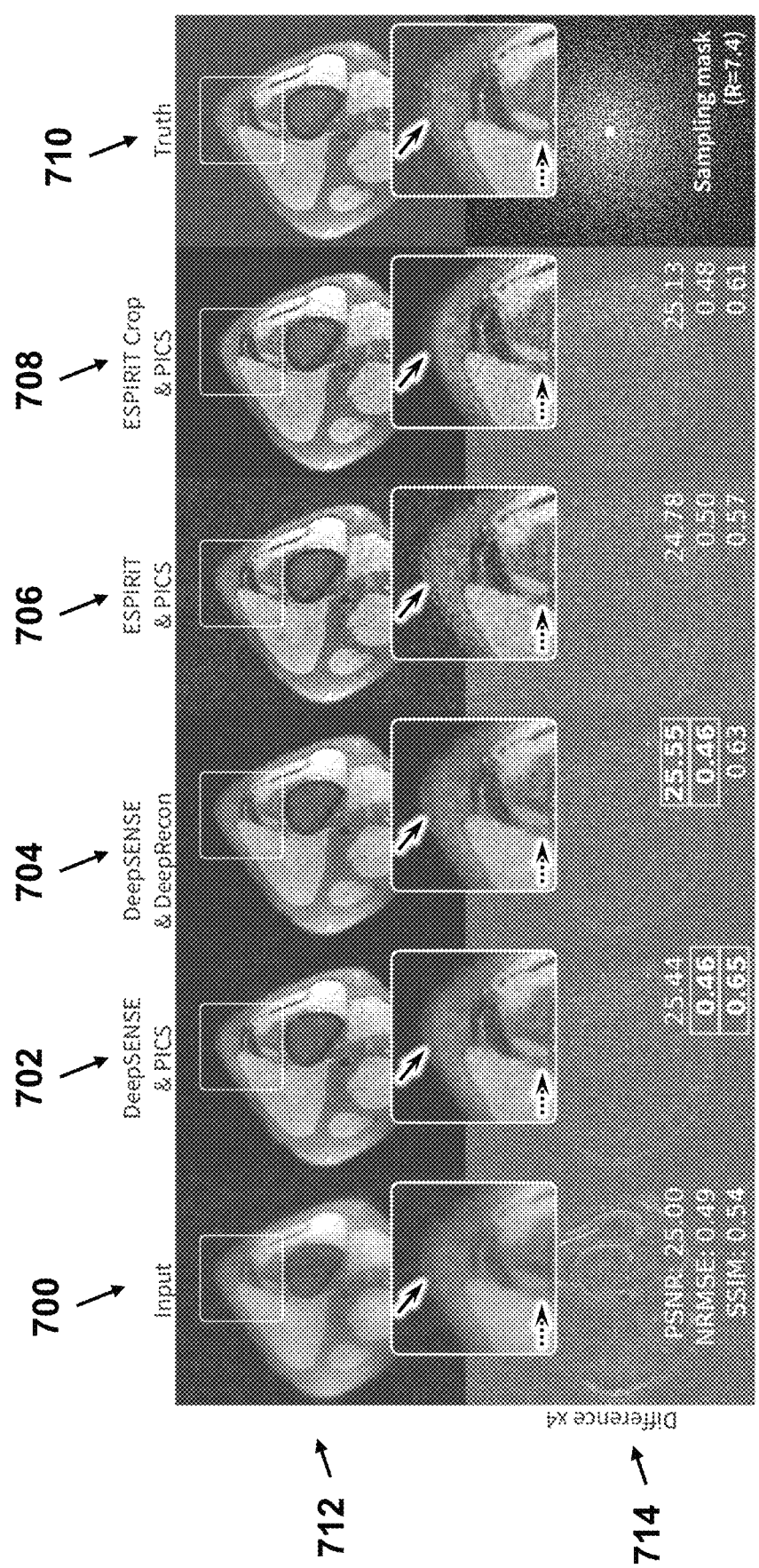
FIG. 7 shows reconstruction images illustrating subsampling an original fully-sampled image with a subsampling mask.

FIG. 7 shows reconstruction using a test example. The input image in column 700 is generated by subsampling the original fully-sampled image in column 710 with the variable-density subsampling mask (R=7.4) shown in column 710 row 714. The DeepSENSE network and the unrolled reconstruction network (DeepRecon) are trained together. The sensitivity maps generated using the trained DeepSENSE network can be applied in conventional parallel imaging and compressed sensing (PICS) algorithm, as shown in column 702 row 712. More accurate reconstruction can be obtained by using the complementary reconstruction network, shown in column 704 row 712. For comparison, maps estimated using ESPIRiT without and with cropping (706 row 712 and 708 row 712, respectively) are applied in a PICS reconstruction. Row 714 in these show the difference ×4 for each image.

Embodiments of the invention are applicable to any magnetic resonance imaging scans that are subsampled. Subsampling reduces the acquisition time for each scan and increases the possible spatiotemporal resolutions for the images. Embodiments of the invention are useful to reduce the total MRI exam duration, which is especially useful to reduce the duration of anesthesia required for imaging uncooperative patients.

Embodiments of the invention are also applicable to any MRI scans where a multi-channel receiver array is used. The network can be trained for combination of the multi-channel that is optimized for SNR and/or optimized to preserve phase information.

There are several advantages of the invention over existing techniques. Conventional sensitivity map estimation algorithms assume that the spatial maps are slowly varying in space. Though this is true for maps for true physical maps, more information can be exploited for more optimal reconstructions. For instance, accurate estimation of where there is no signal in the image is obtained provide a strong prior for model-based reconstructions.

The present invention eliminates possible biases in conventional estimation approaches through an unsupervised learning approach. Conventional algorithms have point of failures, and the unsupervised training avoids these pitfalls.

According to the present invention, the network can be trained to account for subsampling in the calibration region to enable higher subsampling factors. Further, robustness in sensitivity map estimation can be increased by injecting possible image artifacts during training.

Lastly, the entire parallel imaging and compressed sensing process can be performed rapidly with the feed-forward network. For 320×256 images with 8 channels, we observed a total reconstruction time of 0.15 s on an NVIDIA 1080Ti GPU.

The inventors envision that the invention encompasses a number of possible variations or modifications. These include, for example:

Optimal coil combination is typically based on noise statistics along with the coil sensitivity profiles. This approach can be modified to preserve phase information for phase-sensitive applications such as for velocity imaging.

Using the body coil that has minimal receiver shading but lower SNR, an optimal coil combination can be learned.

Coil compression can be integrated into the framework. Standard compression algorithms can be applied to compress the original multi-channel to a smaller number of virtual coils. This compression matrix can also be learned during training.

Ideal sensitivity profiles can be first learned using an unsupervised approach with the fully sampled data as the input. The subsampled input can then be trained to reproduce the same sensitivity profiles as if the images were fully sampled.

Different network architectures can be used for the sensitivity profile map generation and for the reconstruction. These neural network structure can include residual networks (ResNets), U-Nets, autoencoder, recurrent neural networks, and fully connected networks.

In our experiments, $S^H$ transforms the multi-channel dataset to a single channel, and S transforms the single channel back to the multi-channel dataset. To increase flexibility, the sets of multi-channel datasets can be increased. For example, conventionally S would convert a single channel image to an 8-channel image. However, S can be also constructed to convert a single channel image to two 8-channel images.

Only one set of maps were produced and applied for each iteration in the unrolled reconstruction network. For increased flexibility, different optimal sensitivity maps can be produced for each stage of the reconstruction.

Image artifacts and noise can be simulated and introduced in the input data. Such approach will make the resulting network robust to these imaging errors.

The techniques of the invention can be easily extended to incorporate complementary data that includes specific coil hardware used, patient size, data from previously collected scans in the same exam. This additional data can be included as additional input into the $G_\theta(.)$ network to estimate $S_g$.

The invention can be used for additional applications and algorithms that exploit other types of image domain profiles for constraining the reconstruction. For example, different banding profiles from balanced SSFP scans or different magnitude profiles of a metal imaging scan can be considered as sensitivity profile information. This information can be estimated using the invention.

The results from the invention can be integrated with conventional approaches. For instance, the estimate sensitivity maps can be applied in a conventional SENSE reconstruction. Also, the invention can be used to rapidly provide an accurate initialization to limit the number of iterations needed in iterative reconstruction methods.

The output of the network can be used to initialize calibration-less parallel imaging approaches that require iterative algorithms.

The datasets can be acquired with arbitrary sampling trajectories: non-Cartesian (spiral, cones, etc.), echoplanar imaging, and Cartesian.

The multi-channel characterization network can be jointly trained with a neural-network-based reconstruction in an end-to-end fashion.

In conclusion, embodiments of the invention improve upon modern imaging systems that use multi-channel receiver arrays for increased SNR. The techniques of the invention provide a rapid and robust approach to perform optimal coil combination and also enables the ability to leverage the multi-channel information with a rapid, data-driven approach.

The unknown number of iterations needed in state-of-the art advanced image reconstruction algorithms is a major obstacle for their clinical deployment. Though those algorithms enable higher spatial and temporal resolutions and shortened scan durations, the long computation times limits the utility of prior approaches for rapid clinical workflow. The techniques of the present invention provide the ability to estimate sensitivity maps robustly and rapidly in conjunction with a network for rapid reconstruction, resulting in an extremely fast reconstruction technique.

The invention claimed is:

1. A method for magnetic resonance imaging comprising:
   (a) performing by an MRI apparatus multi-channel calibration acquisitions using a multi-channel receiver array of the MRI apparatus;

(b) computing from a convolutional neural network (CNN) and the multi-channel calibration acquisitions an estimated profile map that characterizes properties of the multi-channel receiver array, wherein the profile map is composed of orthogonal vectors and transforms single-channel image space data to multi-channel image space data;

(c) performing by the MRI apparatus a prospectively subsampled imaging acquisition using the multi-channel receiver array to produce k-space data;

(d) processing by the MRI apparatus the k-space data to reconstruct a final image using the estimated profile map.

2. The method of claim 1 wherein the conjugate transpose of the profile map transforms the multi-channel image space data to a set of latent multi-channel image space data; and the profile map transforms this latent multi-channel image space data back to the original multi-channel image space data.

3. The method of claim 1 wherein computing the estimated profile map comprises applying the multi-channel calibration acquisitions as input to the CNN, and wherein output of the CNN is the estimated profile map.

4. The method of claim 1 wherein the multi-channel calibration acquisitions and the prospectively subsampled imaging acquisition are acquired in the same scan.

5. The method of claim 1 wherein the CNN is pretrained using subsampled simulated multi-channel calibration acquisitions and using a regularization function included in a training loss function.

6. The method of claim 1 wherein processing by the MRI apparatus the k-space data to reconstruct a final image uses a regularization function, wherein the regularization function is also used in a training loss function.

7. The method of claim 1 further comprising processing by the MRI apparatus the k-space data to reconstruct a final image comprises using a second CNN trained with k-space data and the profile map from the first CNN, wherein an output of the second CNN is the reconstructed final image.

* * * * *